United States Patent
Gerhard et al.

(10) Patent No.: US 9,310,693 B2
(45) Date of Patent: Apr. 12, 2016

(54) METHOD FOR OPERATING A PROJECTION EXPOSURE TOOL AND CONTROL APPARATUS

(71) Applicant: Carl Zeiss SMT GmbH, Oberkochen (DE)

(72) Inventors: Michael Gerhard, Aalen (DE); Bernd Doerband, Aalen (DE); Toralf Gruner, Aalen-Hofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 220 days.

(21) Appl. No.: 13/782,103

(22) Filed: Mar. 1, 2013

(65) Prior Publication Data

US 2013/0188162 A1 Jul. 25, 2013

Related U.S. Application Data

(63) Continuation of application No. PCT/EP2011/004535, filed on Sep. 8, 2011.

(60) Provisional application No. 61/381,476, filed on Sep. 10, 2010.

(30) Foreign Application Priority Data

Sep. 10, 2010 (DE) .......................... 10 2010 044 969

(51) Int. Cl.
*G03F 7/20* (2006.01)

(52) U.S. Cl.
CPC ............ *G03F 7/70191* (2013.01); *G03F 7/706* (2013.01); *G03F 7/70266* (2013.01); *G03F 7/70833* (2013.01); *G03F 7/70891* (2013.01)

(58) Field of Classification Search
CPC . G03F 7/70258; G03F 7/70875; G03F 7/706; G03F 7/70883; G03F 7/70891; G03F 7/70266
See application file for complete search history.

(56) References Cited

U.S. PATENT DOCUMENTS 4,636,969 A * 1/1987 Kyoden et al. ................. 702/155
4,890,921 A * 1/1990 Pond et al. ..................... 356/485

(Continued)

FOREIGN PATENT DOCUMENTS

DE           103 51 142         5/2004
WO     WO 2008089953 A1  *  7/2008

OTHER PUBLICATIONS

International Search Report and a Written Opinion from the counterpart PCT Application No. PCT/EP2011/004535, dated Mar. 22, 2012.

(Continued)

*Primary Examiner* — Toan Ton
*Assistant Examiner* — Michelle M Iacoletti
(74) *Attorney, Agent, or Firm* — Fish & Richardson P.C.

(57) ABSTRACT

A method for operating a projection exposure tool for microlithography is provided. The projection exposure tool includes an optical system which includes a number of optical elements which, during an imaging process, convey electromagnetic radiation. All of the surfaces of the optical elements interact with the electromagnetic radiation during the imaging process to form an overall optical surface of the optical system. The method includes: determining respective individual thermal expansion coefficients at least two different locations of the overall optical surface; calculating a change to an optical property of the optical system brought about by heat emission of the electromagnetic radiation (during the imaging process upon the basis of the thermal expansion coefficients; and imaging mask structures into an image plane via the projection exposure tool with adaptation of the imaging characteristics of the projection exposure tool so that the calculated change to the optical property is at least partially compensated.

29 Claims, 4 Drawing Sheets

(56) References Cited

U.S. PATENT DOCUMENTS

| 5,953,106 | A | 9/1999 | Unno et al. | |
|---|---|---|---|---|
| 6,747,730 | B2* | 6/2004 | Box | 355/53 |
| 2007/0291243 | A1 | 12/2007 | Suzuki | |
| 2009/0153831 | A1* | 6/2009 | Conradi et al. | 355/68 |
| 2009/0168039 | A1* | 7/2009 | Kok et al. | 355/67 |
| 2009/0231565 | A1* | 9/2009 | Conradi | 355/55 |

OTHER PUBLICATIONS

German Office Actin, with translation thereof, for corresponding DE Appl No. 10 2010 044 0969.5, dated Jun. 29, 2011.

Taiwanese Office Action and Search Report, with translation thereof, for TW Appl No. 100132575, dated Dec. 7, 2015.

* cited by examiner

METHOD FOR OPERATING A PROJECTION EXPOSURE TOOL AND CONTROL APPARATUS

CROSS-REFERENCE TO RELATED APPLICATIONS

This application is a continuation of, and claims priority under 35 U.S.C. §120 to, International Patent Application Serial Number PCT/EP2011/004535, filed Sep. 8, 2011. International Patent Application Serial Number PCT/EP2011/004535 claims priority under 35 U.S.C. §119(e) to U.S. Patent Application Ser. No. 61/381,476, filed Sep. 10, 2010, and also claims benefit under 35 U.S.C. §119 of German Patent Application No. 10 2010 044 969.5, filed on Sep. 10, 2010. The entire disclosure of each of these patent applications is incorporated by reference in the present application.

FIELD

The disclosure relates to a method for operating a projection exposure tool for microlithography, a control apparatus for controlling an exposure process of a projection exposure tool for microlithography, and a method for measuring a thermal expansion coefficient of an optical element.

BACKGROUND

In order to operate a projection exposure tool economically it is desirable to image the structures onto the wafer with the shortest possible exposure time so as to thus achieve the highest possible throughput of exposed substrates in the form of semiconductor wafers. Therefore, high radiation intensities are involved in order to achieve sufficient exposure of each individual substrate. In particular, when using radiation in the ultraviolet or extreme ultraviolet (EUV) wavelength range the effect of intensive radiation can lead to radiation-induced changes in the properties of the individual optical elements of the projection objective of the projection exposure tool. These changed properties bring about aberrations in the projection objective. The extent of these aberrations depends upon the radiation dosage.

With dielectric mirrors used in EUV lithography, due to absorbed radiation, variations in temperature occur on the mirror surface which lead to deformations of the mirror surface.

These deformations lead to image errors in the lithographic imaging, and can change continuously during the imaging process.

SUMMARY

The disclosure provides a system and a method which keep changes in the imaging behaviour during operation of a projection exposure tool for microlithography within narrow limits.

In one aspect, the disclosure provides a method for operating a projection exposure tool for microlithography. Here the projection exposure tool includes an optical system which has a number of optical elements which, during an imaging process, convey electromagnetic radiation. All of the surfaces of the optical elements interact with the electromagnetic radiation during the imaging process forming a (virtual) overall optical surface of the optical system. The method includes: determining respective individual thermal expansion coefficients at least two different locations of the overall optical surface; calculating a change to an optical property of the optical surface brought about by heat emission of the electromagnetic radiation during the imaging process upon the basis of the thermal expansion coefficients; and imaging mask structures into an image plane using the projection exposure tool with adaptation of the imaging characteristics of the projection exposure tool such that the calculated change to the optical property is at least partially compensated.

Thus, according to the disclosure, respective thermal expansion coefficients are first of all determined at least two locations of the overall optical surface. The overall optical surface is not a continuous area, but is made up of the optical surfaces of the optical elements of the optical system. The optical system can, for example, be the projection objective, the illumination system of the projection exposure tool, or also a combination of the illumination system and the projection objective. In other words, thermal expansion coefficients are determined either at least two different locations of one of the optical elements, or at least one location of at least two optical elements.

Here the expansion coefficients can be determined directly on the surface of the respective optical element constituting the optical surface or also at points which lie beneath the surface. Therefore, the thermal expansion coefficients at the respective locations can already be determined on the blanks of the optical elements. Alternatively, the determination can also take place on the finished optical element, i.e. in the case of mirrors the fully coated optical element, or in a production state between the state as a blank and the finished optical element.

Next, according to the disclosure a change to an optical property of the optical system, brought about by heat emission of the electromagnetic radiation during exposure operation of the projection exposure tool, is determined. This type of change to the optical property can include, e.g. a change to the surface shape or a change to the refractive index of the optical element, tensions with resulting birefringence in the optical element and/or determining of layers of the optical element. This type of change generally leads to changed imaging characteristics of the projection exposure tool, and in particular to image errors that can be described via Zernike coefficients.

According to one embodiment, in order to calculate the change to the optical property brought about by the heat emission of the electromagnetic radiation, an irradiation distribution of the individual optical elements is first of all determined by the exposure radiation, from this local heating of the optical elements is determined, and then, with the aid of the thermal expansion coefficients determined, the change to the optical property is determined. The thermal expansion coefficients are at least two different locations of the overall optical surface, in particular at many locations distributed like a grid over the entire optical surface.

Upon the basis of the change to the optical property of the optical system calculated according to the disclosure the imaging characteristics of the projection exposure tool are adapted such that the change to the imaging characteristics brought about by the heat emission of the electromagnetic radiation is corrected. According to one embodiment this correction takes place, in a time-resolved fashion, during the exposure process, i.e. the imaging characteristics are corrected continuously over the time during which a wafer is exposed. Therefore, a so-called forward correction is possible by which, over a specific period of time, a control loop can be dispensed with.

By determining the respective individual thermal expansion coefficients that takes place according to the disclosure it is possible to keep the imaging characteristics stable with a high degree of precision during operation of the projection exposure tool. For example, local variations in the thermal expansion coefficients in the material of the optical elements can thus be taken into consideration accurately. In the case, for example, in which the method according to the disclosure is used in EUV projection exposure tools with an exposure wavelength of <100 nm, in particular 13.5 nm or 6.8 nm, mirror materials made of a material with low expansion coefficients, such as e.g. Zerodur (manufacturer: Schott AG) or ULE (manufacturer: Corning) are used. These materials contain a mixture of crystalline and amorphous portions.

Often, these materials are not perfectly homogeneous, but have local variations in their thermal expansion coefficients. By determining, according to the disclosure, the thermal expansion coefficients at least two different locations, such local variations can be taken into account precisely by a forward correction, by which the stability of the imaging characteristics of the projection exposure tool can be considerably improved.

In one embodiment according to the disclosure, as already mentioned above, the thermal expansion coefficients relate to at least two different optical elements. Furthermore, the thermal expansion coefficients can relate to at least two different locations of an optical element. In a further embodiment according to the disclosure the individual thermal expansion coefficients form a locally resolved expansion coefficient distribution with regard to at least one of the optical elements.

As also already mentioned above, in a further embodiment according to the disclosure, when calculating the change to the optical property of the optical system the radiation distribution striking the individual optical elements during the imaging process is determined, and a resulting temperature distribution on the optical elements is calculated from this. In particular, the temperature profile over the surfaces interacting with the electromagnetic radiation is determined. This can be implemented by calculation of representative rays, for example using of Monte Carlo simulations. For this purpose stored maps of the heat conductivity of the optical elements are used together with stored thermal links and boundary conditions. Using local multiplication of the temperature with thermal expansion coefficients and an extended calculation of representative rays or using stored sensitivities resulting image errors can then be determined.

In a further embodiment according to the disclosure the calculated change to the optical property of the projection objective includes a local deformation of at least one of the optical elements, and this leads to image errors in the imaging characteristics of the projection objective.

In a further embodiment according to the disclosure the thermal expansion coefficients are determined as a function of the temperature at the respective location. In a further embodiment according to the disclosure the thermal expansion coefficients are determined by individually measuring one or more of the optical elements. As already mentioned above, the individual measurement can be taken on the blank or on the finished optical element.

In a further embodiment according to the disclosure the thermal expansion coefficients are determined by interferometric measurement of one or more of the optical elements. This is preferably implemented with a phase shifting interferometer, such as for example a Fizeau interferometer.

In a further embodiment according to the disclosure, when determining the thermal expansion coefficients the optical elements are in a production state which, during the production process, is upstream of the finished state held by the respective optical element during operation in the projection exposure tool. Here, as already mentioned above, the optical elements can be provided as blanks or in a relatively further advanced production state.

In another aspect, the disclosure provides a control apparatus for controlling an exposure process of a projection exposure tool for microlithography. The projection exposure tool includes an optical system with a number of optical elements which convey electromagnetic radiation during an imaging process. All of the surfaces of the optical elements interact with the electromagnetic radiation during the imaging process forming an overall optical surface of the optical system. The control apparatus includes: an inputting device for inputting respective individual thermal expansion coefficients at least two different locations of the overall optical surface; and an evaluating device which is configured to calculate a change to an optical property of the optical system upon the basis of the thermal expansion coefficients which is brought about by heat emission of the electromagnetic radiation during the imaging process. In embodiments according to the disclosure the control apparatus is configured to implement the method according to the disclosure in the individual embodiments mentioned.

The inputting device can be in the form of an entering device for manually entering the individual thermal expansion coefficients or of a data transmission interface for automatically reading in the values.

In one embodiment according to the disclosure the control apparatus further includes a control signal output device which is configured to output a control signal to a manipulation device in order to at least partially compensate for the calculated change to the optical property. Furthermore, the control apparatus can also include the manipulation device. The manipulation device is configured to change the imaging characteristics of the projection exposure tool upon the basis of the control signal. The manipulation device may include: one or several shifting devices for shifting optical elements in a first direction or perpendicular to the latter; one or several rotating devices for rotating optical elements about the first direction or about axes standing perpendicular to the latter (it being possible in particular for the first direction to be orientated orthogonally to the object plane); one or several devices for deforming optical elements; one or several heating or cooling devices for optical elements; one or several plates that can be shifted in relation to one another (optionally aspherised); and one or several interchangeable elements.

Furthermore, a manipulation effect can be affected by a variation in the irradiation strength of areas within or outside of the optically used region at the used wavelength of the lithographic imaging or a wavelength deviating from this. Preferably, this takes place under conditions that prevent additional radiation from passing into the image, e.g. by choosing an appropriate angle of incidence.

In a further embodiment according to the disclosure the evaluating device is configured to determine the radiation distribution striking the individual optical elements during the imaging process when calculating the change to the optical property of the projection objective and to calculate from this a resulting temperature distribution at the optical elements.

The features specified with regard to the embodiment of the method according to the disclosure mentioned above can be applied correspondingly to the control apparatus according to the disclosure. Conversely, the features specified with regard to the embodiments mentioned above of the control apparatus according to the disclosure can be applied correspondingly to the method according to the disclosure.

Furthermore, according to the disclosure a projection objective and/or an illumination system of a projection exposure tool for microlithography is provided which includes the aforementioned control apparatus according to the disclosure. Moreover, according to the disclosure a projection exposure tool for micro lithography is provided which includes this type of projection objective or this type of illumination system.

Furthermore, according to the disclosure a method for measuring a thermal expansion coefficient of an optical element for microlithography is provided. The method includes: setting different temperatures at least one location of the optical element; measuring a surface topography of the optical element at the respective temperature setting; and determining the thermal expansion coefficient at least one location of the optical element from the surface topographies measured.

The measuring method according to the disclosure makes it possible to determine the individual thermal expansion coefficients with a sufficiently high degree of accuracy in order to be able to be used with the method according to the disclosure for operating a projection exposure tool described above. According to one embodiment of the method according to the disclosure for operating a projection exposure tool the individual thermal expansion coefficients at the at least two different locations of the overall optical surface are determined according to the described measuring method according to the disclosure.

In one embodiment of the measuring method according to the disclosure measurement of the surface topography is implemented optically. In particular, the measurement is implemented interferometrically, e.g., using a Fizeau interferometer. Alternatively, the surface topography measurement can also be implemented using a piezoelectric or inductive measuring method.

In a further embodiment according to the disclosure the optical element is located in a vacuum chamber when measuring the topography. Airflows having a negative impact upon the measurement are thus avoided.

In a further embodiment according to the disclosure the thermal expansion coefficient is determined at a number of locations of an optically useable surface of the optical element.

In a further embodiment according to the disclosure, at the respective temperature setting the whole surface has an at least approximately uniform temperature. Within this context a uniform temperature is understood as meaning that the temperature varies by maximum 0.5 K, in particular by maximum 0.1 K, over the surface of the optical element.

In a further embodiment according to the disclosure, at the respective temperature setting the temperature varies over the surface, in particular by more than 1 K, preferably by more than 2 K. For this purpose the surface can be heated locally.

In a further embodiment according to the disclosure, when measuring the surface topography, the temperature distribution of the optical element is monitored, in a locally resolved fashion, with temperature sensors. This preferably takes place in a time-resolved fashion.

In a further embodiment according to the disclosure, in order to set the different surface temperatures, radiation heat is irradiated onto the optical element. This can be implemented, for example, using infrared lasers or infrared emitters. In comparison to heating of the surface using contact heat transfer, the advantage of heat transfer by radiation is that the heat transfer is not dependent upon the roughness and cleanliness of the specimen.

In a further embodiment according to the disclosure, when measuring the surface topography the optical element is disposed in a vacuum chamber having a window for irradiating measuring light. The window is provided with a mirror-coating which transmits at least 20%, in particular at least 40%, of the intensity of visible light and reflects at least 90%, in particular at least 95%, of the intensity of infrared radiation. The window for the irradiation of measuring light can also be called a vacuum window or an outlet window. The mirror-coating layer prevents heat losses from the vacuum chamber, in particular by radiation from the Fizeau plate. At 30° C. the maximum radiation of the Fizeau plate is approximately 10 µm. Due to the high permeability of the mirror-coating layer to visible light excessive weakening of the measuring light is prevented. According to one advantageous embodiment the mirror-covering layer is formed by a layer of gold. According to one embodiment, the layer of gold has a layer thickness of less than 60 nm. The layer thickness is preferably greater than 10 nm, and according to one embodiment is approximately 20 nm.

In a further embodiment according to the disclosure, the topography of the optical element is measured in a vacuum chamber, and the different temperatures on the optical element are set by heating the optical element in an oven outside of the vacuum chamber. Preferably, the interferometer activity is also heated up here in the oven. Before measuring the vacuum chamber is flooded with warm gas. After introducing the heated interferometer activity into the vacuum chamber the vacuum is then established.

BRIEF DESCRIPTION OF THE DRAWINGS

The above and further advantageous features of the disclosure are illustrated in the following detailed description of exemplary embodiments according to the disclosure with reference to the attached diagrammatic drawings, in which.

DETAILED DESCRIPTION OF EXEMPLARY EMBODIMENTS

In the exemplary embodiments described below elements which are similar to one another functionally or structurally are provided as far as possible with the same or similar reference numbers. Therefore, in order to understand the features of the individual elements of a specific exemplary embodiment, one should refer to the description of other exemplary embodiments or to the general description of the disclosure.

Figure 1:
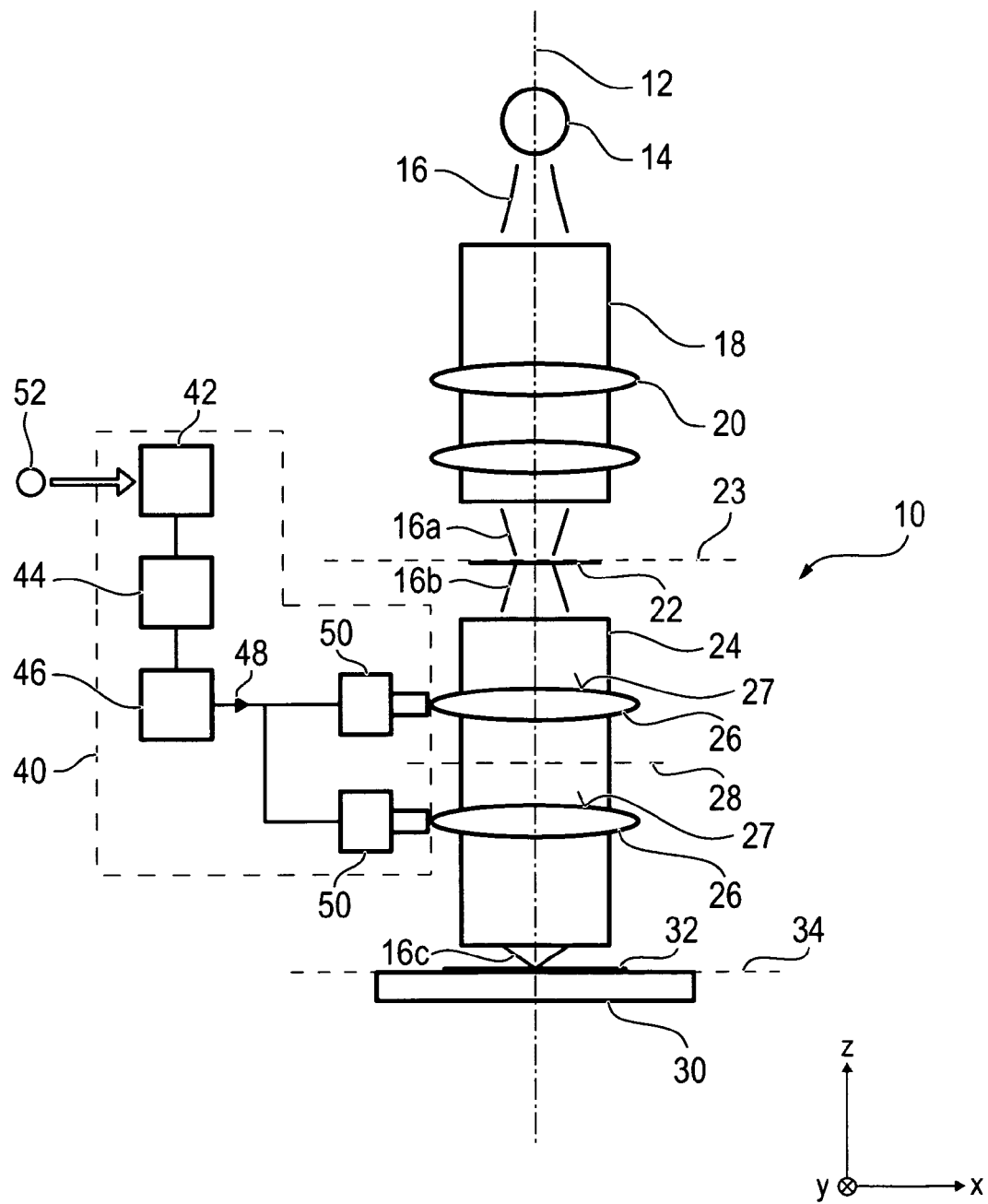
FIG. 1 is a diagrammatic illustration of a projection exposure tool for microlithography according to the disclosure including a projection objective for imaging mask structures into an image plane and a control apparatus for controlling an exposure process.

In order to make it easier to describe the projection exposure tool, in the drawings a Cartesian xyz coordinate system is specified from which the respective relative position of the components illustrated in the figures becomes clear. In FIG. 1 the x direction extends to the right, the y direction perpendicular to the plane of the drawing into the latter, and the z direction upwards.

FIG. 1 shows a greatly simplified block diagram of a projection exposure tool 10 for microlithography. The projection exposure tool 10 serves to generate structures on semiconductor wafers and includes a radiation source 14 for generating electromagnetic radiation 16. The electromagnetic radiation 16 can be extreme ultraviolet radiation (EUV radiation) with a wavelength smaller than 100 nm. The EUV wavelengths can be e.g. 13.5 nm or 6.8 nm. Alternatively, the wavelength of the electromagnetic radiation can also be in the UV range, e.g. 248 nm or 193 nm. In the exemplary embodiment illustrated the radiation source 14 is disposed on an optical axis 12 which is defined by the components of the projection exposure tool 10 described in more detail below.

The electromagnetic radiation 16 generated by the radiation source 14 passes through an illumination system 18 with a number of optical elements 20, e.g. in the form of lenses and/or mirrors, only two of which are shown symbolically in FIG. 1. When using EUV radiation the illumination system 18 only includes mirrors as optical elements 20. The illumination system 18 serves to illuminate a mask 22 which is disposed in the beam path of the electromagnetic radiation 16 downstream of the illumination system 18. The mask 22 is also often called a reticle. The illumination system 18 is configured to generate different angular distributions of the electromagnetic radiation 16a striking the mask 22. Thus, for example, using the illumination system 18 so-called dipole illumination or so-called annular illumination can be set.

The mask 22 contains mask structures which can be imaged onto a substrate 32 in the form of a wafer using a projection objective 24 of the projection exposure tool 10. For this purpose the mask 22 is disposed in an object plane 23 of the projection objective 24. As shown in FIG. 1, the mask 22 can be in the form of a transmission mask or also alternatively, in particular for EUV lithography, be configured as a reflection mask. Like the illumination system 18, the projection objective 24 also includes a plurality of optical elements 26 which can be designed dependently upon the design of the projection objective 24 and the radiation wavelength in the form of lenses and/or mirrors. Only two of these optical elements 26 are shown symbolically in FIG. 1.

The projection objective 24 includes one or more pupil planes 28. A pupil plane 28 is characterised in that the local intensity distribution of the electromagnetic radiation 16 in the pupil plane 28, which converges on a specific field point in an image plane 34 of the projection objective 24, corresponds to the angularly resolved intensity distribution at this field point. An aperture diaphragm for defining the exit pupil of the projection objective 24 can be disposed in the pupil plane 28.

The projection exposure tool 10 serves to image mask structures onto the aforementioned substrate 32. For this purpose the substrate 32 is disposed on a shiftable substrate table 30 in the image plane 34 of the projection objective 24. The substrate 32 includes a radiation-sensitive layer. During exposure, structures of the mask 22 are transferred into the radiation-sensitive layer by an imaging method. Here, in the case in which the projection exposure tool 10 is configured as a so-called step and scan system, the substrate table 30 is shifted in the y direction according to the coordinate system of FIG. 1. After the exposure of the substrate 32 the radiation-sensitive layer is chemically developed, whereupon the substrate 32 is further processed by making use of the structures generated by the exposure in the radiation-sensitive layer. After this a further exposure and further processing supported by this can follow. This process is repeated until the substrate 32 has desired structuring.

In order to achieve short exposure times the electromagnetic radiation 16 is irradiated with a comparably high intensity onto the projection objective 24. This leads to the optical elements 26 of the projection objective 24 being subjected to a very intensive pounding of radiation. This is reinforced by the radiation for at least some of the optical elements 26 not being distributed evenly over the entire usable surface of the latter, but rather being concentrated in comparably small partial regions. Therefore, very high intensities can occur locally on the optical surfaces, and this can lead to a change in the material properties of the optical elements 26. This in turn can result in a change to the optical properties in the exposed regions of the optical elements 26. This leads to a change in the optical properties of the entire projection objective 24.

If the projection exposure tool 10 is operated with EUV radiation, as already mentioned above all of the optical elements 26 of the projection objective 24 are designed as mirrors. Part of the radiation striking the respective mirror during an imaging process is absorbed by the mirror material. This leads to deformations of the mirror surface, and this in turn brings about image errors in the imaging characteristics of the projection objective 24.

The projection exposure tool 10 includes a control apparatus 40 which is configured to compensate for, i.e. correct, changes to the optical properties of the projection objective 24 occurring during an exposure process due to heating of the optical elements 26 using manipulation devices 50. For this purpose the control apparatus 40 includes an evaluating device 44 in which initially the intensity distribution of the radiation striking the mirror surfaces of the individual optical elements 26 is calculated.

Figure 2:
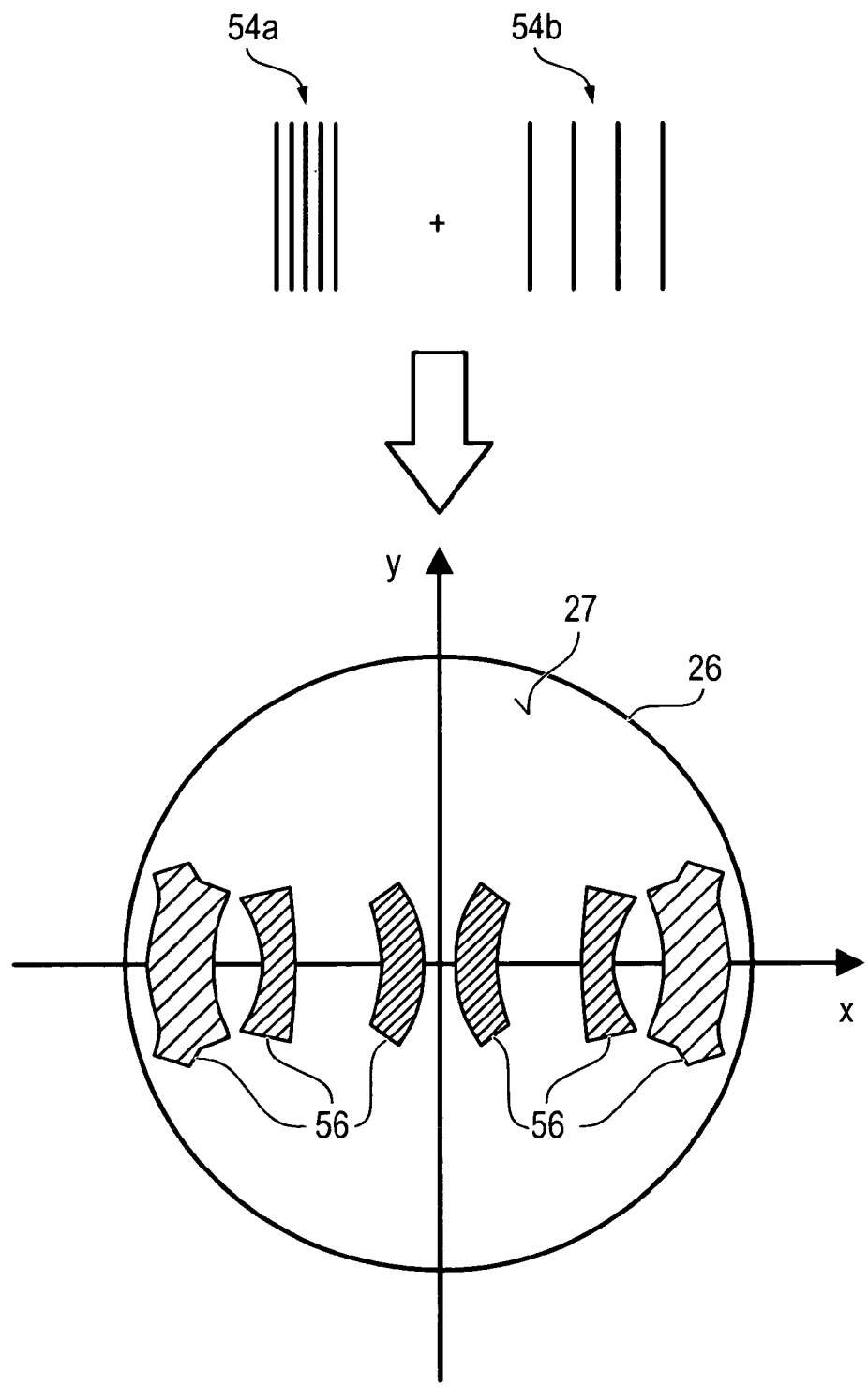
FIG. 2 is an exemplary illumination distribution of an optical element of the projection objective close to the pupil according to FIG. 1 when imaging periodically arranged vertical line groups with different periodicity.

The intensity distribution striking the mirror surfaces of the individual optical elements 26 is dependent upon the layout of the mask 22 and the angular distribution of the illumination radiation 16a. FIG. 2 shows as an example the illuminated regions 56 of a mirror surface 27 of an optical element 26 disposed close to the pupil for the case where the object structures 54a and 54b, also shown in FIG. 2, are imaged in the form of vertical lines with different periodicity using illumination distribution in dipole form.

Depending on the respective mask layout and the angular distribution of the illumination the evaluating device 44 calculates for each of the optical elements 26 the incoming intensity distribution. This can be implemented, for example, by Fourier transformation of the mask layout and subsequent folding with the angular distribution of the illumination radiation 16a. In order to simplify the calculation there can also be a restriction to the calculation of representative rays with intensity weighting.

For each of the optical elements 26 maps of the heat conductivity and thermal links and boundary conditions for a temperature distribution of the elements are stored in the evaluating device 44. Upon the basis of the intensity distribution calculated for the incoming radiation and the aforementioned information on the individual optical elements 26 a temperature distribution in the respective optical element 26 is simulated, time-resolved, by the evaluating device 44.

Furthermore, thermal expansion coefficients of the optical elements already determined in advance are inputted via an inputting device 42. Here, the thermal expansion coefficients are locally resolved over the respective mirror surfaces 27 of the optical elements 26. According to a further embodiment the thermal expansion coefficients 52 are locally resolved three-dimensionally, i.e. for each individual volume element of the optical elements 26. An embodiment according to the disclosure for determining in advance the thermal expansion coefficients is described in more detail below.

Furthermore, the inputted thermal expansion coefficients are multiplied locally with the previously determined temperature distribution on all mirror surfaces 27 of the optical elements 26, and from this a local deformation of the mirror surfaces 27 is calculated with a high degree of accuracy. Image errors resulting from the local deformations are determined by recalculating representative rays or using stored sensitivities. The image errors determined are passed on to the control signal output device 46 which generates from this a control signal 48 which is passed on to manipulation devices 50. The control signal 48 communicates appropriate instructions to the manipulation devices 50 in order to compensate for the calculated image errors.

In FIG. 1, for illustrative purposes, two manipulation devices 50 assigned to the respective optical elements 26 are shown. These serve, for example, to shift the assigned optical element 26 in the direction of the light or perpendicular to the latter or in order to turn about an appropriate axis of rotation. The correction effect upon the image errors can be achieved by a series of further manipulators known to the person skilled in the art. Such manipulators include deformable optical elements, locally heatable and/or coolable optical elements, plates that can be shifted in relation to one another, optionally asphericised, or interchangeable elements. Furthermore, a manipulator effect can be achieved by varying the radiation strength of regions in or outside of the optically used region of the optical elements 26 with the exposure wavelength of the lithographic imaging or a wavelength deviating from this, in order to achieve specific heating effects.

In an exemplary embodiment not shown specifically in the figures the control apparatus 40 is configured to compensate for changes in the illumination system 18 occurring due to the heat input via the electromagnetic radiation 16. This can take place in addition or alternatively to the compensation of the optical properties of the projection objective 24 described above. The procedure when compensating for optical properties of the illumination system 18 is performed similarly to the compensation of the projection objective 24 described above.

In the following, with reference to FIGS. 3 to 5 an apparatus 60 for measuring the aforementioned thermal expansion coefficients 52 is described. The thermal expansion coefficients are measured via the apparatus 60, locally resolved, on the surface 127 of a specimen 126 in the form of one of the optical elements 26. The optical element 26 in the finished state, i.e. in the state in which the latter is used in the projection exposure tool 10, or in a still unfinished state, can be used as the specimen 126. Therefore, for example, the blank of the optical element 26 can be used as the specimen 126.

In order to avoid airflows the apparatus 60 includes a vacuum chamber 62 in which a vacuum of less than 1 mbar prevails. The vacuum chamber is in the form of a cylinder and on the upper side has an outlet window 64 made of silicon glass. The outlet window 64 is coated with a layer of gold that is approximately 20 nm thick. Therefore, the outlet window 64 is mirror-covered for the wavelength range of 2 to 20 µm. With the wavelength of the measuring light 78 the layer of gold still transmits approximately 40% of the light intensity, whereas infrared light in the aforementioned wavelength ranges reflects 95%. At 30° C. the radiation maximum of the Fizeau plate 74 is approx. 10 µm. Therefore, the mirror covering of the outlet window 64 prevents radiation losses with a high degree of effectiveness. It can thus be ensured that heat distribution, which is to a large extent constant in the vacuum chamber 62 and so over the specimen 126, is established. A carrier structure made of aluminium in the form of a cylindrical bowl is disposed in the vacuum chamber 62. The carrier structure 66 serves as a buffer for temperature fluctuations and is supported in relation to the vacuum chamber 62 via thermal insulating elements 68. There is disposed in the interior of the carrier structure 66 a spacer 70 made of material with low heat expansion. The spacer 70 is annular and has on its side facing towards the outlet window 64 three point bearings 72 for holding a Fizeau plate 74. Below, the spacer 70 also has three point bearings 72 which serve to hold the specimen 126. In the held state the Fizeau plate 74 and the specimen 126 are disposed substantially parallel to one another.

There is disposed outside of the vacuum chamber a measuring light source 76 which generates measuring light 78, e.g. in the visible wavelength range, such as for example light of a helium neon laser with a wavelength of 633 nm. The measuring light 78 is irradiated via a collimator lens onto a beam splitter 80 by which it is deflected towards the outlet window 64 of the vacuum chamber 62. First of all the measuring light passes through a collimator lens 82 and then passes into the vacuum chamber 62. Here it strikes the Fizeau plate 74, by which part of the measuring light 78 is reflected back as reference light. The non-reflected part of the measuring light 78 is reflected on the surface 127 of the specimen 126 and then interferes with the reference light on a detection surface of a locally resolving detector 84 in the form of a CCD camera.

The measuring apparatus 60 makes it possible to measure the deviations of the surface 127 of the specimen from a planar surface by evaluating the interferograms recorded by the detector 84 with a high degree of accuracy. In addition to the Fizeau interferometer described the measuring apparatus 60 can needless to say also include other interferometer arrangements suitable for measuring surface deviations or other types of optical arrangements, such as, for example, wavefront measuring devices based upon a Shack Hartmann sensor.

Using the interferometric measurement with the apparatus 60 the thermal expansion coefficients of the specimen 126 are determined, locally resolved, over the entire surface 127 dependently upon temperature. This takes place over a temperature range that includes all temperatures established on the surface 127 during operation of the projection exposure tool. For this purpose, in a first embodiment the entire specimen 126 is heated overall in specific temperature steps, e.g. in steps of 2° C. With each temperature step the surface topography of the specimen 126 is measured.

Depending on the size of the specimen 126 different methods can be used to heat the specimen 126. One possibility for heating consists of direct heating of the carrier structure 66 made of aluminium via heat exchangers or electrically in the vacuum chamber 62. However, the specimen 126 and the Fizeau plate 74 are heated very non-homogeneously here by radiation and by heat conduction via the point bearings 72. Therefore, with this method it takes a long time until thermal equilibrium has been established at which the interferometric measurement can be taken.

Alternatively, the whole cavity including the specimen 126 and the Fizeau plate 74, together with the carrier structure 66, can be heated externally in an oven and then be re-introduced into the vacuum chamber 62. According to a further alternative the vacuum chamber 62 is flooded with warm gas. Only after thermalisation of the cavity is the vacuum established.

However, one waits here until the vacuum chamber, which also becomes hot, has cooled again to ambient temperature before one can start with the interferometric measurement. The decision in favour of one of the methods for setting the temperature on the specimen 126 is made depending on the time that the overall system uses to establish thermal equilibrium.

Figure 3:
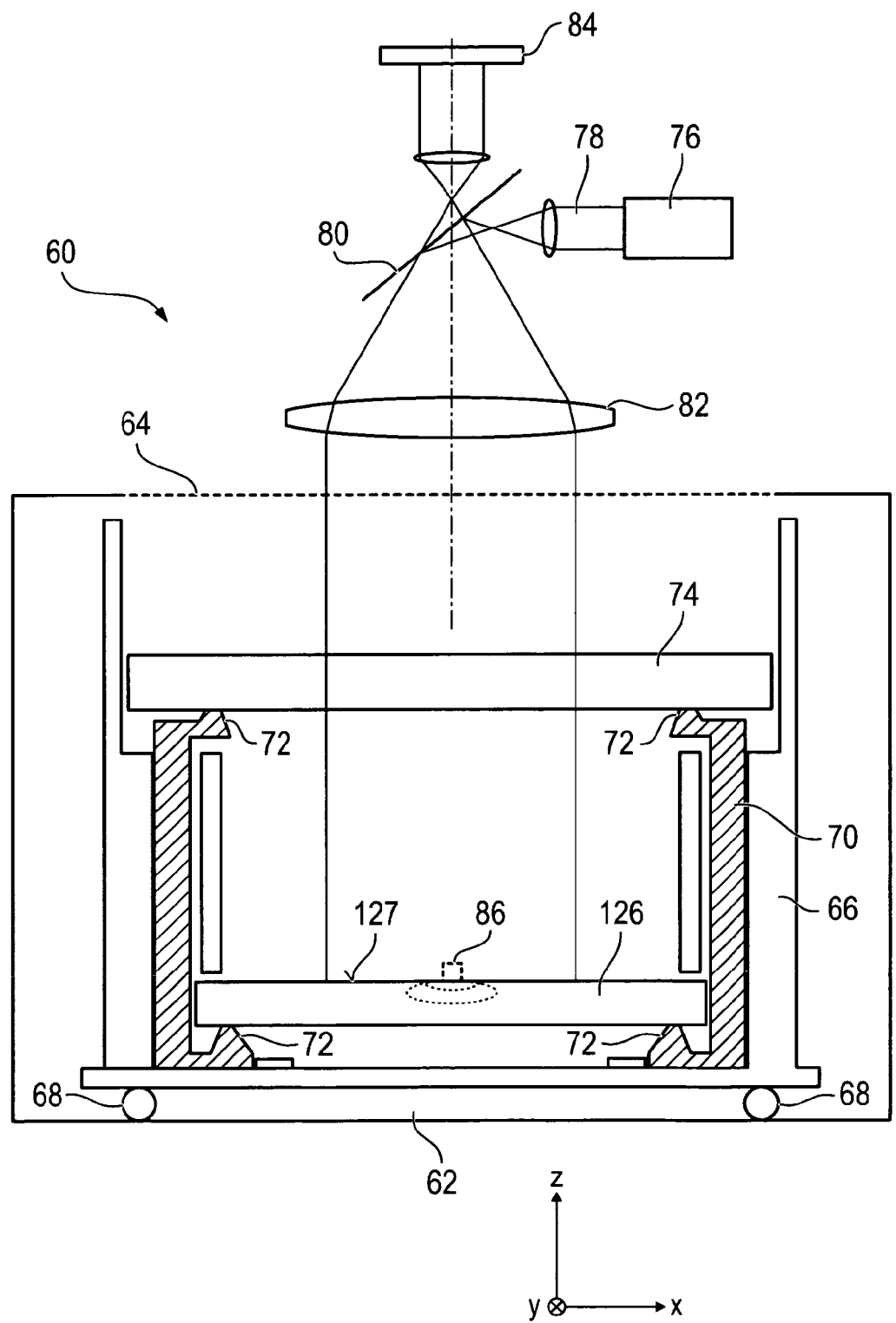
FIG. 3 is a measuring apparatus for the locally resolved measurement of thermal expansion coefficients on an optical element.

A temperature increase or a temperature reduction on the specimen 126 leads to expansion or contraction of the specimen 126 in the z direction according to the coordinate system of FIG. 3, i.e. in the direction perpendicular to the surface 127. The extent of this increase or reduction in the expansion of the specimen 127 is dependent upon the initial temperature and the specific material properties at the location of the expansion change. One important parameter for this material property is the characteristic temperature Tzc (Zero Crossing Temperature) at which the thermal expansion coefficient of the material is zero. Materials with low expansion coefficients, e.g. Zerodur or ULE, which have a mixture of crystalline and amorphous portions, are often used as mirror materials for EUV mirrors. Often these materials are not perfectly homogeneous, but have local variations in Tzc.

Figure 4:
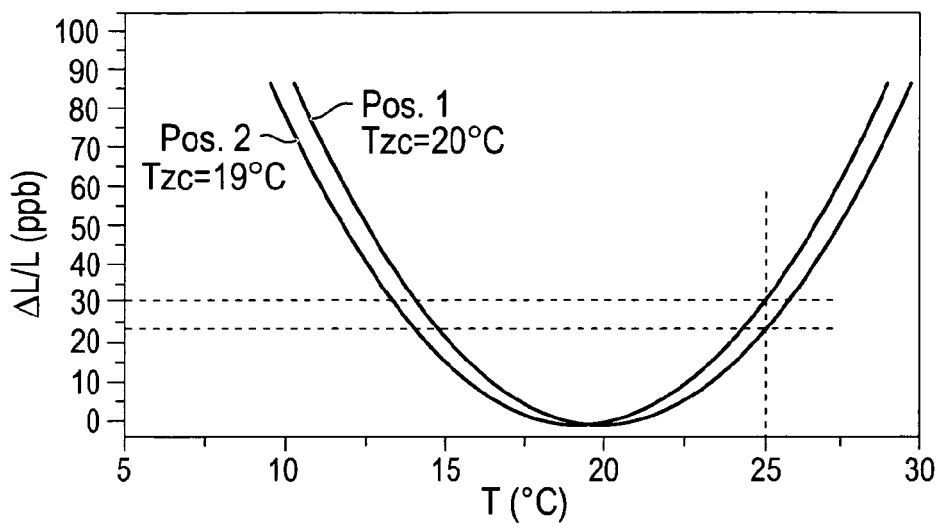
FIG. 4 is a diagram that shows, as an example, the relative expansion depending on the temperature at two different points of a specimen.
Figure 5:
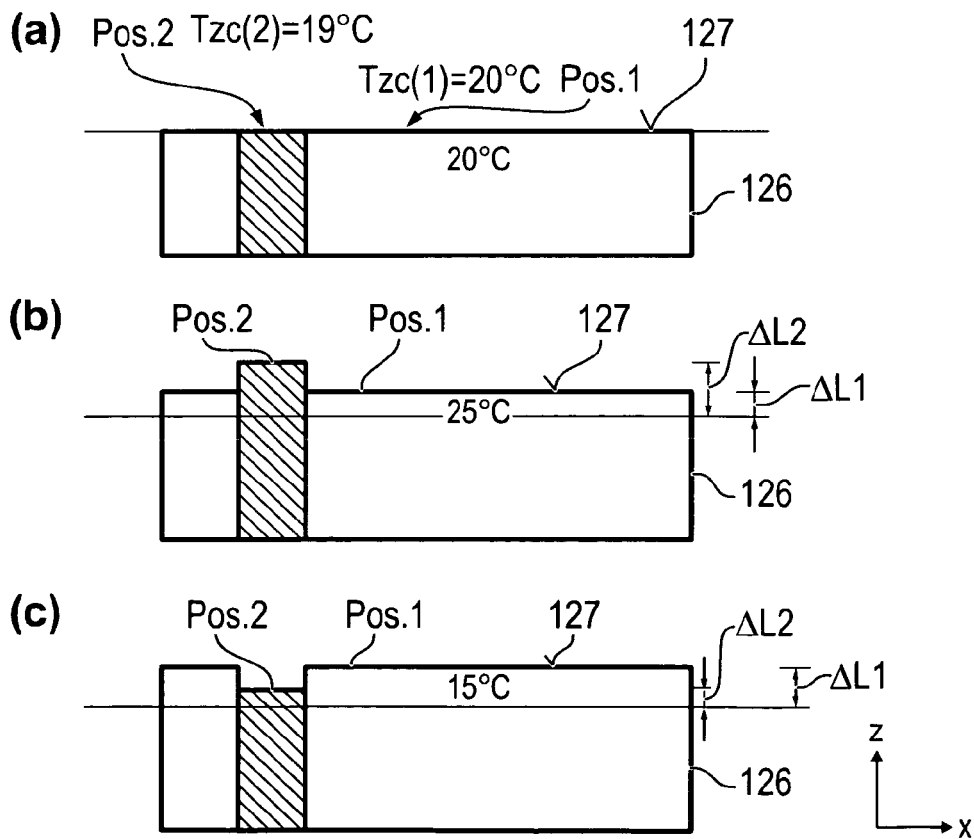
FIG. 5 is an illustration of the effect of temperature changes on the surface topography of a specimen having the temperature characteristics according to FIG. 4.

FIGS. 4 and 5 illustrate the effects of locally varying Tzc parameters with different temperatures of the specimen 126. For position 1 of the specimen surface 127 with Tzc (1)=20° C. and a specimen temperature of 25° C. the thermal expansion coefficient is $8 \cdot 10^{-9}$ 1/K, for position 2 with Tzc (2)=19° C., it is however $9.6 \cdot 10^{-9}$ 1/K.

The resulting form deformation dependently upon the temperature T of a 50 mm thick ULE specimen with Tzc variations of 1° C. in a first approximation is accordingly only $$\Delta L = \frac{g}{2} \cdot d \cdot ((T - Tzc(1))^2 - (T - Tzc(2))^2), \quad (1)$$

d being the thickness of the specimen and g a material constant. $g=1.6 \cdot 10^{-9}$ $K^{-2}$ for ULE. FIG. 4 illustrates the resulting relative length expansion $\Delta L/L$ of the material at both positions dependently upon temperature. The respective expansion profiles are parabolas with apexes at the respective Tzc. In the present case the material at both positions only differs in the parameter Tzc, and this is why the parabolas are only shifted in relation to one another.

If the temperature of the surface 127 is 20° C. in the region of the two Tzcs, as shown under (a) of FIG. 5, the surface is level. If, as shown in (b) of FIG. 5, the temperature is now increased to 25° C., a greater expansion in the z direction takes place at position 2 than in position 1, as indicated in (b) of FIG. 5 by $\Delta L2$ and $\Delta L1$, and as can be read from the curves in FIG. 4. This results in a topography deviating from a level surface for the surface 127. For the aforementioned material example, the following applies for the form deformation: $\Delta L2 - \Delta L1 = 0.44$ nm.

As can be gathered from formula (1), the same form deformation is produced when the specimen is tempered unevenly by 1° C. This results in a corresponding desire for the tempering of better than 0.2° C. corresponding to a form deformation of 0.08 nm. According to the formula for the form deformation $\Delta L$ increases when the specimen temperature is further away from Tzc. However, the desire for uniform tempering then also increases.

If the temperature of the specimen is now lowered to a value below the two Tzcs to a temperature value of, for example, 15° C., the material expands less at position 2 than at position 1, and this produces the topography shown under (c) of FIG. 5 which is inverted with respect to the topography according to (b).

As already mentioned above, in a first embodiment the temperature of the specimen 126 is heated homogeneously in temperature steps of 2° C., starting from 10° C. and ending at 30° C. Here the temperature span is chosen so that all of the Tzcs occurring in the material of the specimen 126 are included. With every temperature step the topography of the surface 127 is measured. The thermal expansion coefficients at every point of the surface 127 are then determined dependently upon the temperature and passed to the inputting device 42 of the projection exposure tool 10 according to FIG. 1 as input data 52.

The setting of the thermal equilibrium is controlled by thermo sensors and by the stability of the interferometric form signal. The accuracy of the measurement is checked by the subsequent cooling back to 20° C. and re-measurement 2° C. away.

For the separation of the form deformation of the specimen 126 and the form deformation of the Fizeau plate 74 or of the spacer 70, within the framework of a calibration process the described procedure is carried out twelve times with different rotational positions of the specimen 126, and the different deformation contributions are separated by calculation. As a final result one also obtains in addition to the relative form deformation of the specimen 126 dependently upon temperature the deformation of the Fizeau plate 74 or the spacer 70 over the chosen temperature range. The Fizeau plate/spacer calibration is generally carried out once and can then also be used for the measurement of further specimens 126.

According to a further embodiment of the measuring method according to the disclosure the specimen 126 is also heated locally in addition to the overall heating. This takes place by defined heating with a heat source 86 which is drawn in FIG. 3 on the surface 127 of the specimen 126 as an optional element. The heat source 86 can include a heating wire and/or a radiation source for emitting infrared radiation. The advantage of the heat input via radiation heat is that the heat transferred is independent of the roughness and cleanliness of the specimen 126.

The heat transfer rate by radiation onto the specimen material is determined in a separate experiment. The wavelength of the radiation is chosen such that the output is absorbed on the surface. Radiation wavelengths of approximately 2800 nm are advantageous. The radiation in this wavelength range is totally absorbed, for example, by ULE, whereas silicon glass transmits radiation of this wavelength. Therefore, the radiation source can be applied in the form of an infrared emitter, even outside of the vacuum chamber 62, so that the radiation radiates through the outlet window and the Fizeau plate 74 onto the specimen 126.

Additional local heating has the advantage that the structural condition of the heat input into the optical element is imaged more accurately during operation in the projection objective 24. In this embodiment the local form deformation is then determined dependently upon the specimen temperature at the corresponding location of the surface 127. Due to the existence of a temperature Tzc in materials with low thermal expansion it is not necessary to detect the local form deformation accurately. In a first approximation the form deformation is at a minimum when the following condition is fulfilled:

$$\text{form deformation} = 0 \text{ for } \Delta T_{locally}/2 + T_{overall} = Tzc. \quad (2)$$

Since one is not given any sharp differentiation between overall temperature and local heating, but rather a continuous profile, Tzc is obtained with known heat transfer on the specimen via a "finite element calculation".

The advantage of this embodiment with additional local heating is on the one hand closeness to the actual application, but also the fact that a minimum of local deformations is easier to detect interferometrically than longwave profiles of the thermal expansion coefficient of a homogeneously heated substrate. Since the local heating mainly takes place on the surface, with this method surface influences, variations in the heat expansion coefficient dependently upon the depth below the surface and coating effects can be examined and simulated.

In one exemplary embodiment a heat output of 100 mW is introduced locally into the center of the surface 127 of a specimen 126 made of ULE material. Here a local temperature increase of on average 4 Kelvin is achieved. With the overall heating the overall specimen temperature is increased in 5 Kelvin steps and additionally heated locally at a number of points of the specimen. Here, according to a simulation calculation, a form deformation of 0.03 nm is produced for a thermal expansion coefficient of $10^{-9}$ 1/K. For a position on the specimen surface 127 with Tzc=20° C. and a specimen temperature of 25° C. the value of the thermal expansion coefficient is $8 \cdot 10^{-9}$ 1/K, from which a form deformation of approximately 0.24 nm results. For a position on the surface 127 with Tzc=19° C. one obtains an expansion coefficient of $9.6 \cdot 10^{-9}$ 1/K and a form deformation of 0.29 nm. This means that a temperature deviation of 0.1 K already produces the same effect as a Tzc difference of 1K.

Using the precisely known characteristic of the deformation the variations in the thermal expansion coefficient can be separated easily from the noise of the interferometry signal and from variations due to overall temperature non-homogeneities.

LIST OF REFERENCE NUMBERS

10 projection exposure tool
12 optical axis
14 radiation source
16, 16*a*, 16*b*, 16*c* electromagnetic radiation
18 illumination system
20 optical element of the illumination system
22 mask
23 object plane
24 projection objective
26 optical element of the projection objective
27 mirror surface
28 pupil plane
30 substrate table
32 substrate
34 image plane
40 control apparatus
42 inputting device
44 evaluating device
46 control signal output device
48 control signal
50 manipulation device
52 thermal expansion coefficients
54*a*, 54*b* object structure to be imaged
56 illuminated region
60 apparatus for measuring a thermal expansion coefficient
62 vacuum chamber
64 outlet window
66 carrier structure
68 thermal insulating elements
70 spacer
72 point bearing
74 Fizeau plate
76 measuring light source
78 measuring light
80 beam splitter
82 collimator lens
84 locally resolving detector
86 heat source
126 specimen
127 surface

What is claimed is:

1. A method for operating a projection exposure tool for microlithography comprising an optical system which includes a number of optical elements which, during an imaging process, convey electromagnetic radiation, all of the surfaces of the optical elements interacting with the electromagnetic radiation during the imaging process to form an overall optical surface of the optical system, the method comprising:
based on thermal expansion coefficients, calculating a change to an optical property of the optical system due to heat emission of the electromagnetic radiation during the imaging process, the thermal expansion coefficients respectively describing a change in size of thermal expansion with a change in temperature at at least two different locations of the overall optical surface of the optical system, the at least two different locations of the overall optical surface of the optical system comprising two different locations of the same optical element; and
taking into account the calculated change to the optical property, using the projection exposure tool to image mask structures into an image plane so that the calculated change to the optical property is at least partially compensated.

2. The method of claim 1, wherein the thermal expansion coefficients relate to at least two different optical elements.

3. The method of claim 1, wherein:
when calculating the change to the optical property of the optical system, the radiation distribution striking the individual optical elements during the imaging process is determined; and
a resulting temperature distribution on the optical elements is calculated from this determination.

4. The method of claim 1, wherein the calculated change to the optical property of the optical system includes a local deformation of at least one of the optical elements.

5. The method according to of claim 1, wherein the thermal expansion coefficients are determined as a function of a temperature at a respective location.

6. The method according to of claim 1, wherein the thermal expansion coefficients are determined by individually measuring one or more of the optical elements.

7. The method according to of claim 1, wherein the thermal expansion coefficients are determined by interferometric measurement of one or more of the optical elements.

8. The method according to of claim 1, further comprising determining the thermal expansion coefficients when the optical elements are in a production state which, during a process of production, is prior to a final state of each respective optical element during operation of the projection exposure tool.

9. The method according to of claim 1, further comprising determining the thermal expansion coefficients via a process which comprises:
setting different temperatures at least one location of an optical element;
measuring a surface topography of the optical element at each of the temperature settings; and determining the thermal expansion coefficient at the at least one location of the optical element from the measured surface topographies.

10. The method of claim 9, comprising optically measuring the surface topographies.

11. The method of claim 9, comprising determining the thermal expansion coefficient at a number of locations of an optically useable surface of the optical element.

12. The method of claim 9, wherein the optical element has an optically useable surface, and at a temperature setting the whole surface has a uniform temperature.

13. The method of claim 9, wherein the optical element has an optically useable surface, and at a temperature setting the temperature varies over the surface.

14. The method of claim 9, comprising, when measuring the surface topography, using temperature sensors to monitor the temperature distribution of the optical element.

15. The method of claim 9, comprising striking the optical element with radiation heat to set the different surface temperatures.

16. The method of claim 9, wherein, when measuring the surface topography, the optical element is disposed in a vacuum chamber having a window, the window having a reflective coating which transmits at least 20% of the intensity of visible light and reflects at least 90% of the intensity of infrared radiation.

17. The method of claim 1, further comprising:
measuring a surface topography of each of the at least two different locations at multiple different temperatures; and
using the measured surface topographies to determine, as a function of temperature, respective individual thermal expansion coefficients at each of at least two different locations of the overall optical surface.

18. The method of claim 17, comprising using interferometry to measure the surface topographies.

19. A control apparatus configured to control an exposure process of a projection exposure tool for microlithography, the projection exposure tool including an optical system with a number of optical elements which convey electromagnetic radiation during an imaging process, all of the surfaces of the optical elements interacting with the electromagnetic radiation during the imaging process to form an overall optical surface of the optical system, the control apparatus comprising:
an evaluation device configured to calculate a change to an optical property of the optical system on the basis of thermal expansion coefficients, the change being due to heat emission of the electromagnetic radiation during the imaging process, the thermal expansion coefficients respectively describing a change in size of thermal expansion with a change in temperature at at least two different locations of the overall optical surface of the optical system, the at least two different locations of the overall optical surface of the optical system comprising two different locations of the same optical element.

20. The control apparatus of claim 19, further comprising a control signal output device configured to output a control signal to a manipulation device to at least partially compensate the calculated change to the optical property.

21. The control apparatus of claim 20, further comprising the manipulation device, wherein the manipulation device is configured to change the imaging characteristics of the projection exposure tool on the basis of the control signal.

22. The control apparatus of claim 19, wherein the evaluation device is configured to:
a) determine the radiation distribution striking the individual optical elements during the imaging process when calculating the change to the optical property of the optical system; and
b) based on a), calculate from this a resulting temperature distribution at the optical elements.

23. A projection objective, comprising:
a control apparatus according to claim 19,
wherein the projection objective is a projection objective for microlithography.

24. An illumination system, comprising
a control apparatus according to claim 19,
wherein the illumination system is an illumination system for microlithography.

25. A projection exposure tool, comprising:
an illumination system; and
a projection objective,
wherein the projection exposure tool includes a control apparatus according to claim 19, and the projection exposure tool is for microlithography.

26. The projection exposure tool of claim 25, wherein the projection objective comprises the control apparatus.

27. The projection exposure tool of claim 25, wherein the illumination system comprises the control apparatus.

28. A method for operating a projection exposure tool for microlithography comprising an optical system which includes a number of optical elements which, during an imaging process, convey electromagnetic radiation, all of the surfaces of the optical elements interacting with the electromagnetic radiation during the imaging process to form an overall optical surface of the optical system, the method comprising:
setting different temperatures at first and second locations of an optical element;
measuring a surface topography of the optical element at the first and second locations at each of the temperature settings;
using the measured surface topographies to determine the thermal expansion coefficient at the first and second locations of the optical element;
based on the determined thermal expansion coefficients, calculating a change to an optical property of the optical system due to heat emission of the electromagnetic radiation during the imaging process; and
taking into account the calculated change to the optical property, using the projection exposure tool to image mask structures into an image plane so that the calculated change to the optical property is at least partially compensated.

29. The method of claim 28, comprising using interferometry to measure the surface topographies.

* * * * *

UNITED STATES PATENT AND TRADEMARK OFFICE
CERTIFICATE OF CORRECTION

PATENT NO. : 9,310,693 B2
APPLICATION NO. : 13/782103
DATED : April 12, 2016
INVENTOR(S) : Michael Gerhard, Bernd Doerband and Toralf Gruner Page 1 of 1

It is certified that error appears in the above-identified patent and that said Letters Patent is hereby corrected as shown below:

Title Page, Col. 2, line 9 of Abstract, delete "at least two different" and insert -- at at least two different --.

Title Page, Col. 2, line 12 of Abstract, delete "(during" and insert -- during --.

Specification

Col. 1, line 67, delete "at least two" and insert -- at at least two --.

Col. 2, line 10, delete "at least two" and insert -- at at least two --.

Col. 3, line 16, delete "at least two different" and insert -- at at least two different --.

Col. 4, lines 14-15, delete "at least two different" and insert -- at at least two different --.

Col. 5, line 13, delete "at least one" and insert -- at at least one --.

Claims

Col. 14, line 46, Claim 5, delete "of".

Col. 14, line 49, Claim 6, delete "of".

Col. 14, line 52, Claim 7, delete "of".

Col. 14, line 55, Claim 8, delete "of".

Col. 14, line 61, Claim 9, delete "of".

Signed and Sealed this
Second Day of August, 2016

Michelle K. Lee
*Director of the United States Patent and Trademark Office*